(12) United States Patent
Tang (10) Patent No.: US 11,075,354 B2
(45) Date of Patent: Jul. 27, 2021

(54) DISPLAY PANEL AND METHOD FOR MANUFACTURING THEREOF (71) Applicant: Shenzhen China Star Optoelectronics Semiconductor Display Technology Co., Ltd., Shenzhen (CN)

(72) Inventor: Jia Tang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/339,383

(22) PCT Filed: Mar. 13, 2019

(86) PCT No.: PCT/CN2019/078010
§ 371 (c)(1),
(2) Date: Apr. 4, 2019

(87) PCT Pub. No.: WO2020/151064
PCT Pub. Date: Jul. 30, 2020

(65) Prior Publication Data
US 2020/0243793 A1 Jul. 30, 2020

(30) Foreign Application Priority Data
Jan. 25, 2019 (CN) .................. 201910071405.7

(51) Int. Cl.
H01L 51/52 (2006.01)
H01L 51/50 (2006.01)
H01L 27/32 (2006.01)

(52) U.S. Cl.
CPC ...... *H01L 51/5237* (2013.01); *H01L 27/3246* (2013.01); *H01L 51/5012* (2013.01); *H01L 51/5203* (2013.01)

(58) Field of Classification Search
None
See application file for complete search history.

(56) References Cited

U.S. PATENT DOCUMENTS

2010/0244070 A1 9/2010 Lee et al.
2017/0104043 A1 4/2017 Gao
(Continued)

FOREIGN PATENT DOCUMENTS

CN 101847649 9/2010
CN 107170900 9/2017
(Continued)

*Primary Examiner* — Jay C Chang (57) ABSTRACT

A display panel is provided. The display panel includes a substrate, an active component disposed on the substrate, a passivation layer covering the active component, a planar layer covering the passivation layer, a first electrode disposed on the planar layer, a pixel defining layer covering the first electrode and the planar layer, an insulating layer disposed on the pixel defining layer, a conductive layer disposed on the insulating layer, an electroluminescence layer, and a second electrode. The first electrode is electrically connected to the active component by extending through an opening disposed in the passivation layer and the planar layer. The insulating layer covers a part of the pixel defining layer. The electroluminescence layer is disposed between the first electrode and the second electrode. A thickness of the electroluminescence layer is larger than or equal to a thickness of the insulating layer.

16 Claims, 6 Drawing Sheets (56) References Cited

U.S. PATENT DOCUMENTS

| | | |
|---|---|---|
| 2018/0190740 A1* | 7/2018 | Bang .................. H01L 27/3246 |
| 2018/0331164 A1 | 11/2018 | Hsu |
| 2019/0067390 A1 | 2/2019 | Gao |
| 2019/0280059 A1 | 9/2019 | Tang et al. |

FOREIGN PATENT DOCUMENTS

| | | |
|---|---|---|
| CN | 107565048 | 1/2018 |
| CN | 207425859 | 5/2018 |
| CN | 108511489 | 9/2018 |
| JP | 2008-135325 | 6/2008 |
| WO | WO 2016/176992 | 11/2016 |

* cited by examiner

DISPLAY PANEL AND METHOD FOR MANUFACTURING THEREOF

RELATED APPLICATIONS

This application is a National Phase of PCT Patent Application No. PCT/CN2019/078010 having International filing date of Mar. 13, 2019, which claims the benefit of priority of Chinese Patent Application No. 201910071405.7 filed on Jan. 25, 2019. The contents of the above applications are all incorporated by reference as if fully set forth herein in their entirety.

FIELD AND BACKGROUND OF THE INVENTION

The present invention relates to a display panel and method for manufacturing thereof, and more particularly, to an organic light-emitting diode (OLED) display panel.

Due to material limitations, when a large sized top-emission display device emits light, this results in IR drop problems around the center of a display area, which causes display inconformity. In addition, a process for manufacturing the large size top-emission display device is complicated. In order to simplify the process and overcome the IR drop problem, it is necessary to provide a display panel and a manufacturing method to solve the problem existing in the prior art.

SUMMARY OF THE INVENTION

When a large size top-emission display device emits light, there is an IR drop problem around the center of the display area, which causes display inconformity.

According to one embodiment of the present invention, a display panel is provided. The display panel includes a substrate, an active component disposed on the substrate, a passivation layer covering the active component, a planar layer covering the passivation layer, a first electrode disposed on the planar layer, a pixel defining layer covering the first electrode and the planar layer, an insulating layer disposed on the pixel defining layer, a conductive layer disposed on the insulating layer, an electroluminescence layer electrically connected to the first electrode, and a second electrode electrically connected the electroluminescence layer. The first electrode is electrically connected to the active component by extending through an opening disposed in the passivation layer and the planar layer. The insulating layer covers a part of the pixel defining layer. The electroluminescence layer is disposed between the first electrode and the second electrode. A thickness of the electroluminescence layer is larger than or equal to a thickness of the insulating layer.

In one embodiment of the present invention, the electroluminescence layer covers the first electrode, an upper portion of the conductive layer, a sidewall of the pixel defining layer, and a part of upper portion of the pixel defining layer, and the electroluminescence layer contacts with a sidewall of the insulating layer.

In one embodiment of the present invention, the second electrode covers the electroluminescence layer, and the second electrode contacts with a part of sidewall of the conductive layer.

In one embodiment of the present invention, the thickness of the electroluminescence layer is less than or equal to 4500 Å.

In one embodiment of the present invention, a thickness of the conductive layer is larger than a thickness of the second electrode.

In one embodiment of the present invention, a total thickness of the insulating layer and the conductive layer is equal to or larger than 1 μm.

In one embodiment of the present invention, the conductive layer includes metal materials or organic conductive materials.

In one embodiment of the present invention, a shape of the conductive layer includes a rectangle, a trapezoid, or a groove.

According to another embodiment of the present invention, a method for manufacturing a display panel is provided. The method for manufacturing a display panel includes providing a substrate; forming an active component on the substrate; forming a passivation layer covering the active component; forming a planar layer covering the passivation layer; defining an opening penetrating through the planar layer and the passivation layer, and the opening exposes a source of the active component; forming a first electrode on the planar layer, and the first electrode is electrically connected to the active component through the opening; forming a pixel defining layer covering the first electrode and the planar layer; forming an insulating layer on the pixel defining layer, and the insulating layer covers a part of the pixel defining layer; forming a conductive layer covering the insulating layer; forming an electroluminescence layer, and the electroluminescence layer covers the first electrode, an upper portion of the conductive layer, a sidewall of the pixel defining layer, and a part of upper portion of the pixel defining layer, and the electroluminescence layer contacts with a sidewall of the insulating layer, and the electroluminescence layer is electrically connected to the first electrode; and forming a second electrode covering the electroluminescence layer, and the second electrode contacts with a part of sidewall of the conductive layer.

In one embodiment of the present invention, a thickness of the insulating layer is less than or equal to the electroluminescence layer.

According to another embodiment of the present invention, a top-emission display device is provided. The top-emission display device includes a display panel. The display panel includes a substrate; an active component disposed on the substrate; a passivation layer covering the active component; a planar layer covering the passivation; a first electrode disposed on the planar layer, and the first electrode is electrically connected to the active component by extending through an opening disposed in the passivation layer and the planar layer; a pixel defining layer covering the first electrode and the planar layer; an insulating layer disposed on the pixel defining layer, the insulating layer covers a part of the pixel defining layer; a conductive layer disposed on the insulating layer; an electroluminescence layer electrically connected to the first electrode; and a second electrode electrically connected the electroluminescence layer. The electroluminescence layer is disposed between the first electrode and the second electrode.

In one embodiment of the present invention, the electroluminescence layer covers the first electrode, an upper portion of the conductive layer, a sidewall of the pixel defining layer, and a part of upper portion of the pixel defining layer, and the electroluminescence layer contacts with a sidewall of the insulating layer.

In one embodiment of the present invention, the second electrode covers the electroluminescence layer, and the second electrode contacts with a part of sidewall of the conductive layer.

In one embodiment of the present invention, the thickness of the electroluminescence layer is less than or equal to 4500 Å.

In one embodiment of the present invention, a thickness of the conductive layer is larger than a thickness of the second electrode.

In one embodiment of the present invention, a total thickness of the insulating layer and the conductive layer is equal to or larger than 1 μm.

In one embodiment of the present invention, the conductive layer includes metal materials or organic conductive materials.

In one embodiment of the present invention, a shape of the conductive layer includes a rectangle, a trapezoid, or a groove.

In one embodiment of the present invention, the insulating layer covers a part of the pixel defining layer In one embodiment of the present invention, a thickness of the electroluminescence layer is larger than or equal to a thickness of the insulating layer.

As compared to the prior art, the display panel of the embodiment of the present invention can be used in a thin film transistor or an organic light emitting diode, and the display panel can also increase the light-emitting area of the top-emission display device. Therefore, IR drop occurred in the top-emission display device can be solved when the top-emission display device is emitting.

DESCRIPTION OF SPECIFIC EMBODIMENTS OF THE INVENTION

In order to make the present invention more comprehensible, the preferred embodiments are described below in detail with reference to the accompanying drawings.

Figure 1:
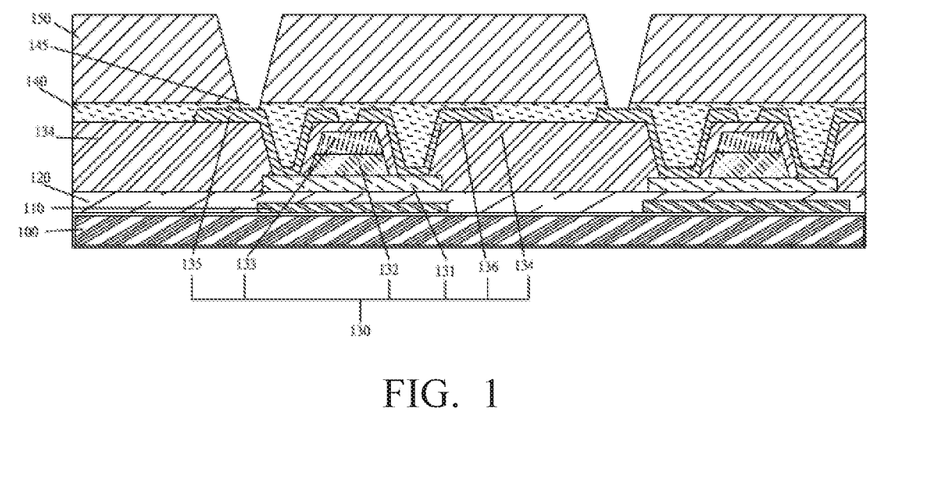
FIG. 1, FIG. 2, FIG. 3, FIG. 4, FIG. 5 and FIG. 6 are schematic views showing a top-emission display panel according to one embodiment of the present invention.

Referring to FIG. 1, a substrate 100 is firstly provided and a light shielding layer 110 and a buffer layer 120 are formed on the substrate 100, and the buffer layer 120 covers the light shielding layer 110. Next, an active component 130 is formed on the buffer layer 120. The active component 130 includes a metal oxide layer 131, a gate insulation layer 132, a gate electrode 133, an interlayer dielectric layer 134, a source 135, and a drain 36. Preferably, the active component 130 is a thin film transistor (TFT). More preferably, the active component 130 is a top-gate thin film transistor (top-gate TFT). Preferably, the metal oxide layer 131 is composed of indium gallium zinc oxide (IGZO). Specifically, the metal oxide layer 131 is formed on the buffer layer 120, the gate insulation layer 132 is formed on the metal oxide layer 131, the interlayer dielectric layer 134 is formed on the buffer layer 120, and the interlayer dielectric layer 134 covers a sidewall of the gate insulation layer 132, an upper portion and a sidewall of the gate electrode 133, a part of the metal oxide layer 131, and the buffer layer 120. Next, an opening is defined by etching the interlayer dielectric layer 134, and the source 135 and the drain 136 are formed in the opening. After forming the active component 130, a passivation layer 140 is formed on the active component 130, and the passivation layer 140 covers the interlayer dielectric layer 134 and the active component 130. A planar layer 150 is formed to cover the passivation layer 140, and an opening 145 is defined to penetrate through the planar layer 150 and the passivation layer 140. The source 135 of the active component 130 is exposed in the opening 145.

Figure 2:
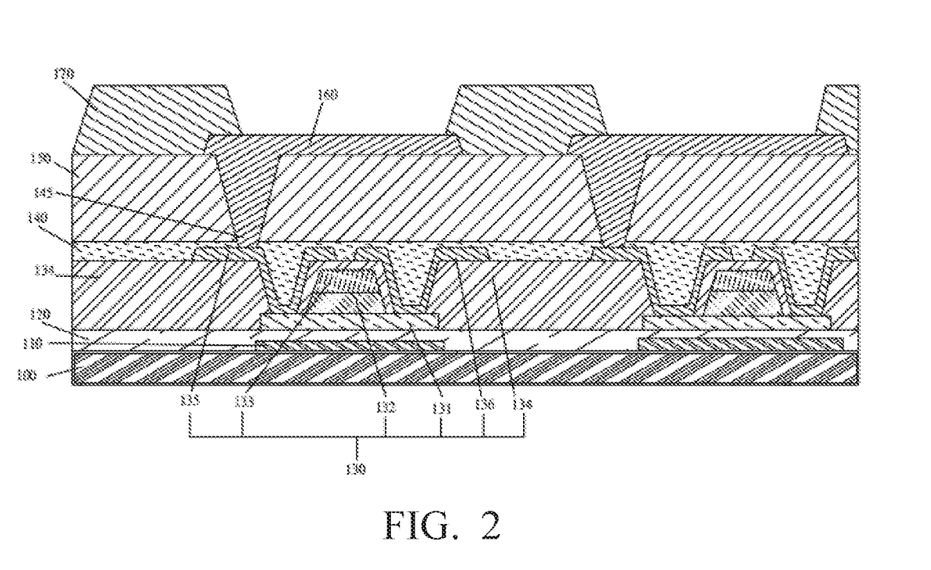

Referring to FIG. 2, a first electrode 160 is formed on the planar layer 150, and the first electrode is an anode. The first electrode 160 is electrically connected to the source 135 through the opening 145 penetrating the planar layer 150 and the passivation layer 140. Furthermore, a pixel defining layer 170 is formed to cover the first electrode 160 and the planar layer 150.

Figure 3:
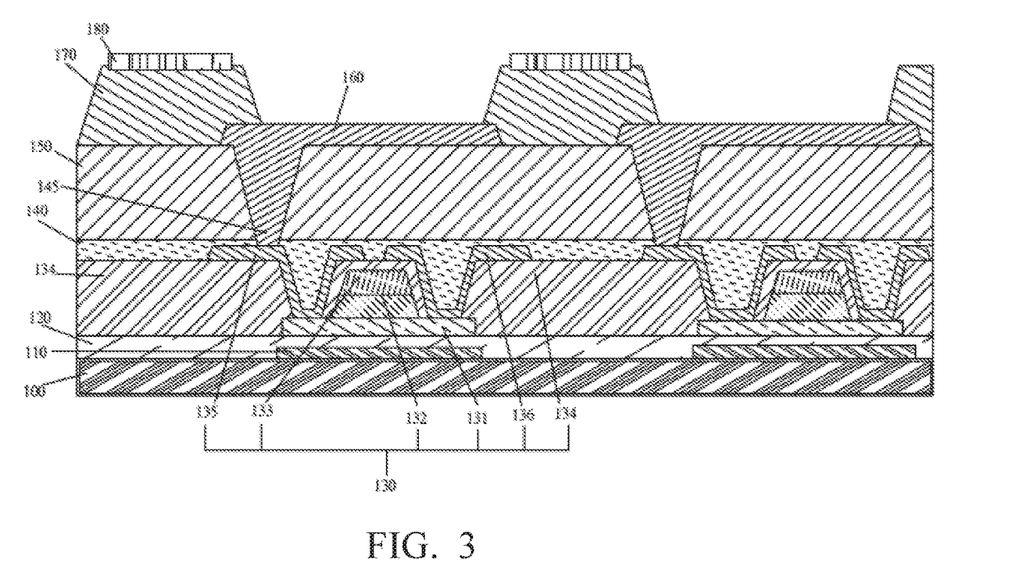

Referring to FIG. 3, an insulating layer 180 is formed on the pixel defining layer 170, and the insulating layer 180 covers a part of the pixel defining layer 170.

Figure 4:
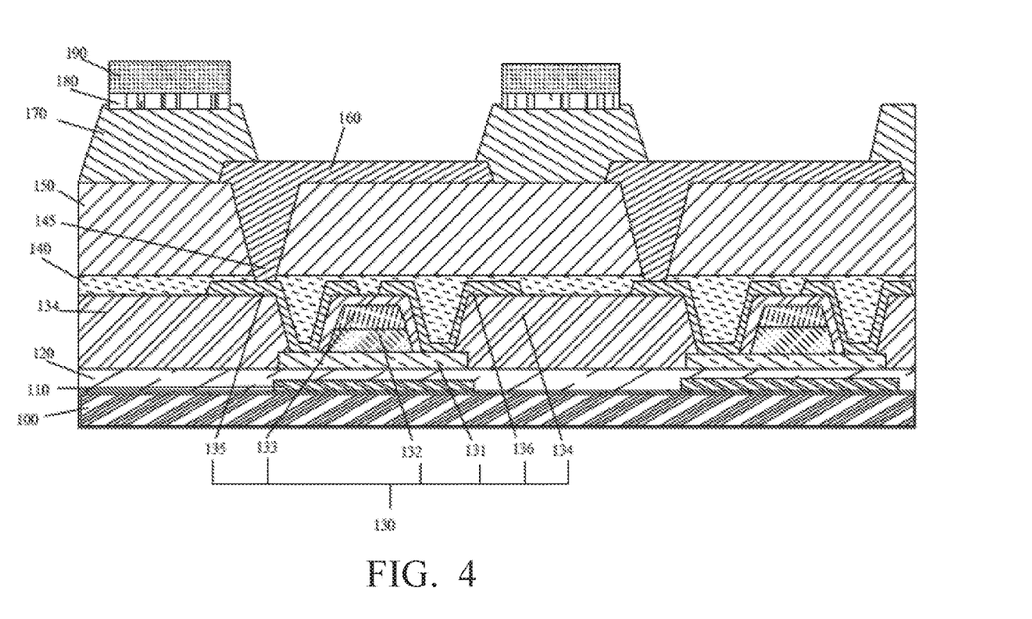

Referring to FIG. 4, a conductive layer 190 is formed on the insulating layer 180, and the conductive layer 190 covers the insulating layer 180. Preferably, a total thickness of the insulating layer 180 and the conductive layer 190 is larger than or equal to 1 μm, and the conductive layer 190 includes metal materials or organic conductive materials, and the conductive layer 190 is presented as a rectangular shape.

Figure 5:
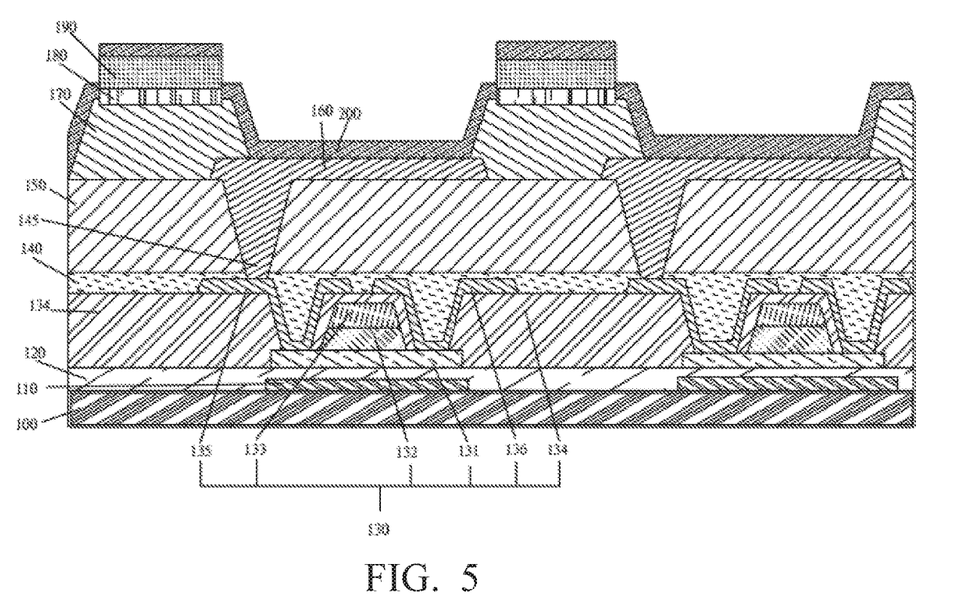

Referring to FIG. 5, an electroluminescence layer 200 is formed, and the electroluminescence layer 200 covers the first electrode 160, an upper portion of the conductive layer 190, a sidewall of the pixel defining layer 170, and a part of an upper portion of the pixel defining layer 170, and the electroluminescence layer 200 contacts with a sidewall of the insulating layer 180. Preferably, a thickness of the insulating layer 180 is equal to a thickness of the electroluminescence layer 200.

Figure 6:
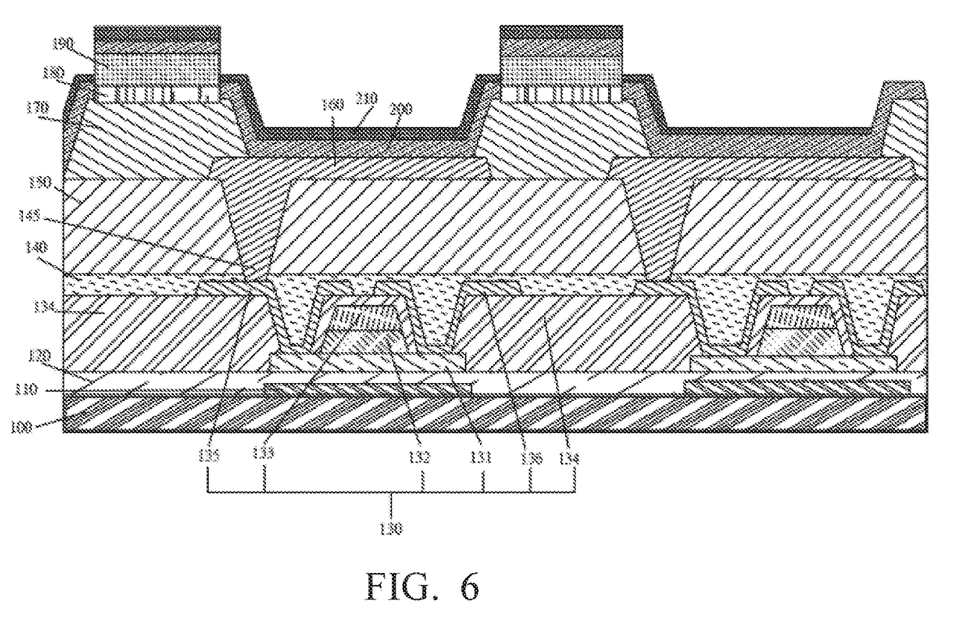

Referring to FIG. 6, a second electrode 210 is formed to cover the electroluminescence layer 200, and the second electrode 210 is a cathode, and the second electrode 210 contacts with a part of a sidewall of the conductive layer 190. Preferably, the thickness of the electroluminescence layer 200 is less than or equal to 4500 Å, and a thickness of the conductive layer 190 is larger than a thickness of the second electrode 210.

Figure 7:
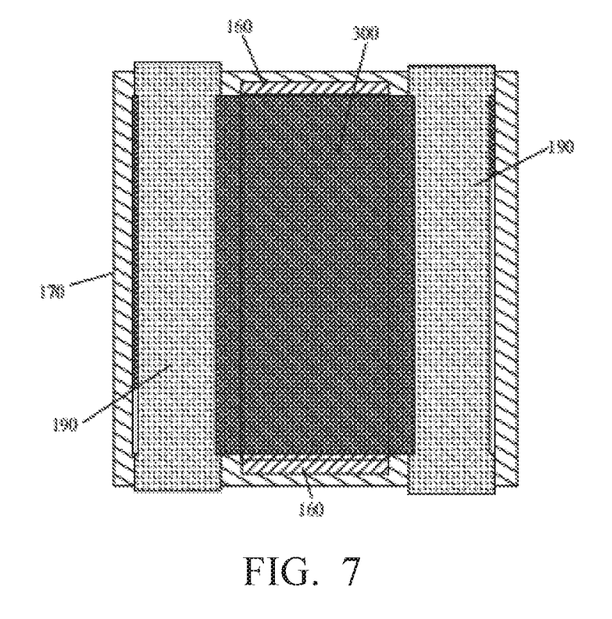
FIG. 7 is a plan view of a light-emitting area of the display panel according to one embodiment of the present invention.

Referring to FIG. 7, it is a plan view of a light-emitting area of the display panel according to one embodiment of the present invention. The electroluminescence layer and the second electrode are not shown in the FIG. 7. The conductive layer 190 is disposed on the pixel defining layer 170. The first electrode 160 is disposed between two conductive layers 190. A sub-pixel light-emitting area 300 is disposed between two first electrodes 160. Also, a sub-pixel light-emitting area 300 is disposed between two conductive layers 190.

Figure 8:
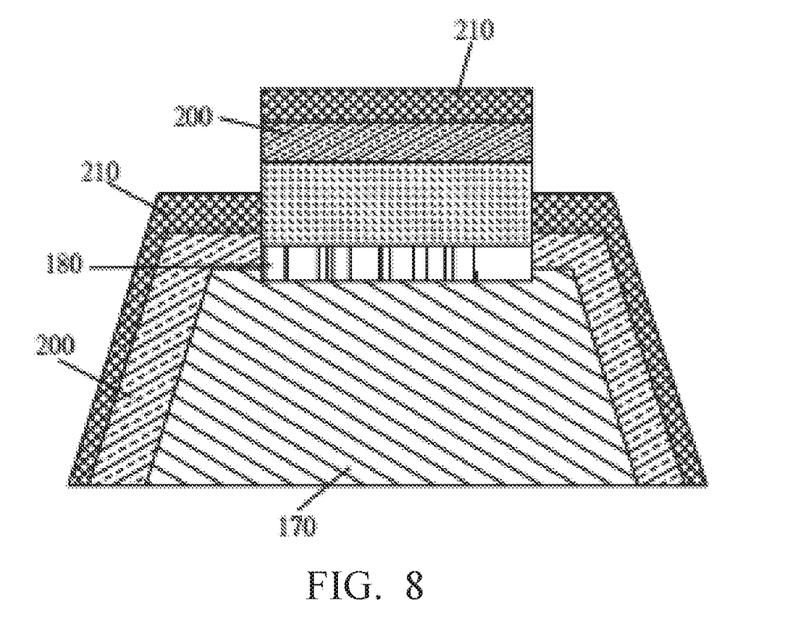
FIG. 8 is a partial schematic view of a display panel according to another embodiment of the present invention.

Referring to FIG. 8, it is a partial schematic view of a display panel according to another embodiment of the present invention. The thickness of the electroluminescence layer 200 is less than or equal to 4500 Å, but the thickness of the electroluminescence layer 200 is larger than a thickness of the insulating layer 180. The insulating layer 180 is disposed on the upper portion of the pixel defining layer 170. A total thickness of the insulating layer 180 and the conductive layer 190 is larger than or equal to 1 μm. A thickness of the conductive layer 190 is larger than a thickness of the second electrode 210.

Figure 9:
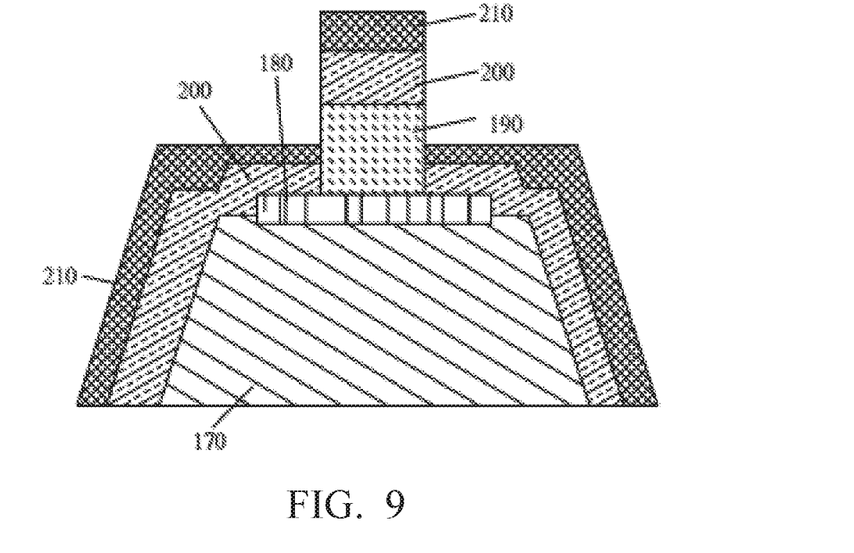
FIG. 9 is a partial schematic view of a display panel according to another embodiment of the present invention.

Referring to FIG. 9, it is a partial schematic view of a display panel according to another embodiment of the present invention. The insulating layer 180 is disposed on the upper portion of the pixel defining layer 170, and the conductive layer 190 is disposed on an upper portion of the insulating layer 180. The conductive layer 190 is presented as a rectangular shape, and the electroluminescence layer 200 is presented as a step ladder shape. When the electroluminescent layer 200 is presented as a step ladder shape, a contact area between the second electrode 210 and the conductive layer 190 can be increased.

Figure 10:
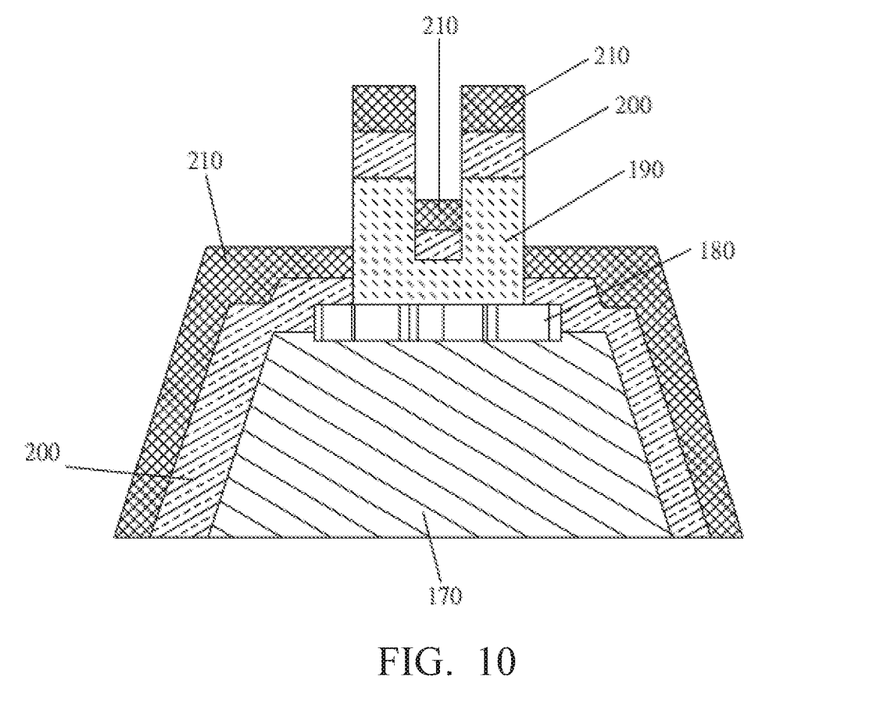
FIG. 10 is a partial schematic view of a display panel according to another embodiment of the present invention.

Referring to FIG. 10, it is a partial schematic view of a display panel according to another embodiment of the present invention. The conductive layer 190 is presented as a rectangular shape, and the he electroluminescent layer 200 is presented as a groove shape. When the electroluminescent layer 200 is presented as a groove shape, a contact area between the second electrode 210 and the conductive layer 190 can be increased.

Figure 11:
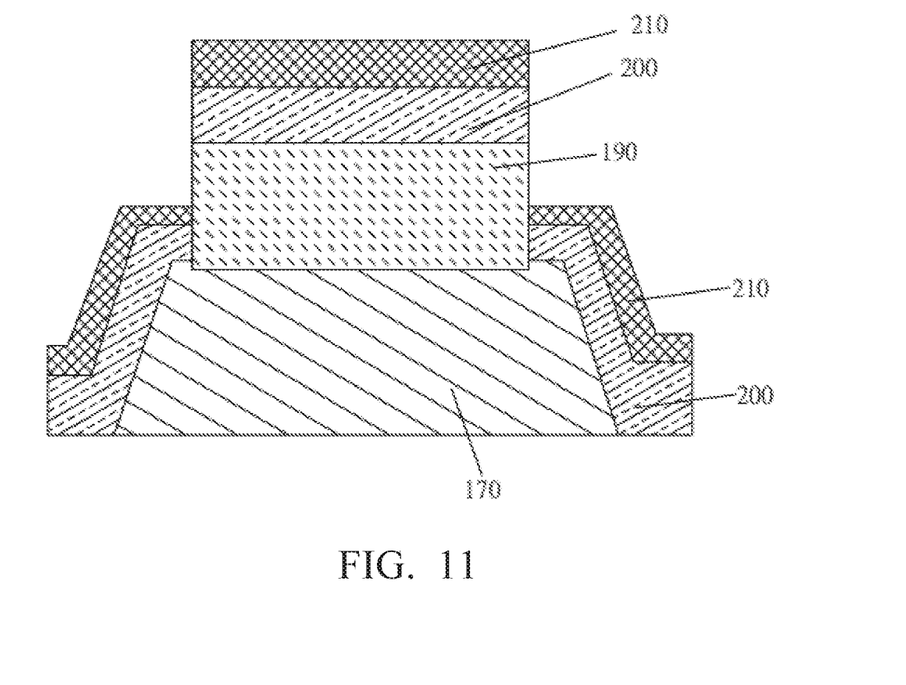
FIG. 11 is a partial schematic view of a display panel according to another embodiment of the present invention.

Referring to FIG. 11, it is a partial schematic view of a display panel according to another embodiment of the present invention. The conductive layer 190 is directly formed on the pixel defining layer 170, and the electroluminescent layer 200 is formed on the conductive layer 190. There is no insulating layer on the pixel defining layer 170. Preferably, the conductive layer 190 is composed of organic conductive materials.

According to the embodiment of the present invention, the display panel can be used in a thin film transistor or an organic light emitting diode, and the display panel can also increase the light-emitting area of the top-emission display device. Therefore, IR drop occurred in the top-emission display device can be solved when the top-emission display device is emitting.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel, comprising:
   a substrate;
   an active component disposed on the substrate;
   a passivation layer covering the active component;
   a planar layer covering the passivation layer;
   a first electrode disposed on the planar layer, wherein the first electrode is electrically connected to the active component by extending through an opening disposed in the passivation layer and the planar layer;
   a pixel defining layer covering the first electrode and the planar layer;
   an insulating layer disposed on the pixel defining layer, wherein the insulating layer covers a part of the pixel defining layer;
   a conductive layer disposed on the insulating layer;
   an electroluminescence layer electrically connected to the first electrode; and
   a second electrode electrically connected to the electroluminescence layer, wherein the electroluminescence layer is disposed between the first electrode and the second electrode;
   wherein a thickness of the electroluminescence layer is larger than or equal to a thickness of the insulating layer;
   wherein the electroluminescence layer covers the first electrode, an upper portion of the conductive layer, a sidewall of the pixel defining layer, and a part of upper portion of the pixel defining layer, and the electroluminescence layer contacts with a sidewall of the insulating layer and the upper portion of the conductive layer;
   wherein the pixel defining layer does not contact with the upper portion of the conductive layer; and
   wherein a portion of the conductive layer is exposed from the electroluminescence layer, and the electroluminescence layer directly contacts a top surface of the conductive layer.

2. The display panel according to claim 1, wherein the second electrode covers the electroluminescence layer, and the second electrode contacts with a part of sidewall of the conductive layer.

3. The display panel according to claim 1, wherein the thickness of the electroluminescence layer is less than or equal to 4500 Å.

4. The display panel according to claim 1, wherein a thickness of the conductive layer is larger than a thickness of the second electrode.

5. The display panel according to claim 1, wherein a total thickness of the insulating layer and the conductive layer is equal to or larger than 1 μm.

6. The display panel according to claim 1, wherein the conductive layer comprises metal materials or organic conductive materials.

7. The display panel according to claim 1, wherein a shape of the conductive layer comprises a rectangle, a trapezoid, or a groove.

8. A top-emission display device, comprising:
   a display panel, wherein the display panel comprises:
   a substrate;
   an active component disposed on the substrate;
   a passivation layer covering the active component;
   a planar layer covering the passivation layer;
   a first electrode disposed on the planar layer, wherein the first electrode is electrically connected to the active component by extending through an opening disposed in the passivation layer and the planar layer;
   a pixel defining layer covering the first electrode and the planar layer;
   an insulating layer disposed on the pixel defining layer, wherein the insulating layer covers a part of the pixel defining layer;
   a conductive layer disposed on the insulating layer;
   an electroluminescence layer electrically connected to the first electrode; and
   a second electrode electrically connected to the electroluminescence layer, wherein the electroluminescence layer is disposed between the first electrode and the second electrode;
   wherein the electroluminescence layer covers the first electrode, an upper portion of the conductive layer, a sidewall of the pixel defining layer, and a part of upper portion of the pixel defining layer, and the electroluminescence layer contacts with a sidewall of the insulating layer and the upper portion of the conductive layer;

wherein the pixel defining layer does not contact with the upper portion of the conductive layer; and wherein a portion of the conductive layer is exposed from the electroluminescence layer, and the electroluminescence layer directly contacts a top surface of the conductive layer.

9. The top-emission display device according to claim 8, wherein the second electrode covers the electroluminescence layer, and the second electrode contacts with a part of sidewall of the conductive layer.

10. The top-emission display device according to claim 8, wherein a thickness of the electroluminescence layer is less than or equal to 4500 Å.

11. The top-emission display device according to claim 8, wherein a thickness of the conductive layer is larger than a thickness of the second electrode.

12. The top-emission display device according to claim 8, wherein a total thickness of the insulating layer and the conductive layer is equal to or larger than 1 μm.

13. The top-emission display device according to claim 8, wherein the conductive layer comprises metal materials or organic conductive materials.

14. The top-emission display device according to claim 8, wherein a shape of the conductive layer comprises a rectangle, a trapezoid, or a groove.

15. The top-emission display device according to claim 8, wherein the insulating layer covers a part of the pixel defining layer.

16. The top-emission display device according to claim 8, wherein a thickness of the electroluminescence layer is larger than or equal to a thickness of the insulating layer.

* * * * *